United States Patent
Endo et al.

(10) Patent No.: US 7,345,556 B2
(45) Date of Patent: Mar. 18, 2008

(54) VARIABLE ATTENUATION CIRCUIT HAVING LARGE ATTENUATION AMOUNT WITH SMALL CIRCUIT SIZE

(75) Inventors: Masaaki Endo, Tokyo (JP); Masaki Yamamoto, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 231 days.

(21) Appl. No.: 11/191,465

(22) Filed: Jul. 28, 2005

(65) Prior Publication Data

US 2006/0028291 A1    Feb. 9, 2006

(30) Foreign Application Priority Data

Aug. 6, 2004    (JP)    ............ 2004-004725 U

(51) Int. Cl.
*H01P 1/22*    (2006.01)
(52) U.S. Cl. .................... 333/81 R; 327/308
(58) Field of Classification Search ........... 333/81 R, 333/17.2; 327/308, 309, 320
See application file for complete search history.

(56) References Cited

U.S. PATENT DOCUMENTS 4,668,882 A * 5/1987 Matsuura ............... 327/308

FOREIGN PATENT DOCUMENTS

| JP | 10-065469 | 3/1998 |
|----|-----------|--------|
| JP | 2000-13162 | 1/2000 |

* cited by examiner

*Primary Examiner*—Stephen E. Jones
(74) *Attorney, Agent, or Firm*—Brinks Hofer Gilson & Lione

(57) ABSTRACT

A variable attenuation circuit includes an attenuation circuit which has a first semiconductor variable impedance element, and an attenuation control circuit of which the impedance is changed by a control voltage to be applied from the outside and which has a second semiconductor variable impedance element for controlling the impedance of the first semiconductor variable impedance element. The attenuation circuit and the attenuation control circuit are connected in cascade. Therefore, signals can be attenuated by the attenuation control circuit, in addition to the attenuation circuit.

4 Claims, 1 Drawing Sheet

VARIABLE ATTENUATION CIRCUIT HAVING LARGE ATTENUATION AMOUNT WITH SMALL CIRCUIT SIZE

This application claims the benefit of priority to Japanese Patent Application No. 2004-004725 filed on Aug. 6, 2004, herein incorporated by reference.

BACKGROUND OF THE INVENTION

1. Field of the Invention

The present invention relates to a variable attenuation circuit that is used for a television tuner or the like.

2. Description of the Related Art

A variable attenuation circuit according to the related art has a configuration in which a first attenuator unit 41a, an RF amplifying circuit 42, and a second attenuator unit 41b are connected in cascade, as shown in FIG. 2. Both attenuator units 41a and 41b have the same circuit configuration and thus only the first attenuator unit 41a will be described. A PIN diode D1a is provided between an input terminal INa and an output terminal OUTa of the first attenuator unit 41a. An anode of the PIN diode D1a is connected to the input terminal INa via a connection capacitor C1a and a cathode of the PIN diode D1a is connected to the output terminal OUTa via a capacitor C2a.

The anode of the PIN diode D1a is applied with a control voltage v2 via a driving resistor R1a, a driving transistor Tr1a, and a high-pass cut-off coil L1a. The cathode of the PIN diode D1a is grounded via a resistor R2a.

Further, the anode of the PIN diode D1a is grounded via a direct current (DC) blocking capacitor C3a, a PIN diode D2a, and a capacitor C4a. An anode of the PIN diode D2a, that is, the connection point between the capacitor C3a and the PIN diode D2a, is applied with a predetermined voltage v4a. The voltage v4a is generated, for example, by dividing a predetermined power supply voltage B by the resistors R3a and R4a, and is set to be lower than a voltage v3a on the cathode of the PIN diode D1a, when the control voltage v2 is the maximum. A cathode of the PIN diode D2a is connected to the cathode of the PIN diode D1a via a PIN diode D3a.

Then, as the control voltage v2 is changed, the collector current of the transistor Tr1a is changed, such that the current flowing in the PIN diodes D1a to D3a is controlled (for example, see Japanese Unexamined Patent Application Publication No. 2000-013162 (FIG. 1)).

In the attenuator unit 41a, the current flowing In the PIN diodes D1a to D3a is controlled by the driving transistor Tr1a, such that the attenuation amount is changed. In this case, when the attenuation amount is insufficient, the attenuator unit 41b having the same configuration as the attenuator unit 41a needs be further provided. Accordingly, the circuit size becomes large and thus the tuner or the like cannot be reduced in size.

SUMMARY OF THE INVENTION

It is an object of the invention to provide to a variable attenuation circuit that has a large attenuation amount with a small circuit size.

In order to achieve the above-described object, according to a first aspect of the invention, a variable attenuation circuit includes an attenuation circuit which has a first semiconductor variable impedance element, and an attenuation control circuit of which the impedance is changed by a control voltage to be applied from the outside and which has a second semiconductor variable impedance element for controlling the impedance of the first semiconductor variable impedance element. The attenuation circuit and the attenuation control circuit are connected to a signal path in cascade.

Further, according to a second aspect of the invention, the first semiconductor variable impedance element may be constituted by a PIN diode and the second semiconductor variable impedance element may be constituted by a transistor. The PIN diode may be coupled between a signal line and a ground, and a collector and an emitter of the transistor may be coupled to the signal line and the ground, respectively. The control voltage is applied to a base of the transistor, such that a collector current of the transistor flows in the PIN diode.

Further, according to a third aspect of the invention, the transistor may be constituted by a PNP transistor, and an anode of the PIN diode may be coupled to the signal line and may be pulled up to a power supply via a choke inductor. A collector of the PNP transistor may be grounded, and an emitter thereof may be coupled to the signal line and may be pulled up to the power supply via a first resistor. Further, the emitter of the PNP transistor may be connected to a cathode of the PIN diode via a radio-frequency insulating element.

Further, according to a fourth aspect of the invention, an amplifying circuit may be interposed between the attenuation circuit and the attenuation control circuit.

According to the first aspect of the invention, the variable attenuation circuit includes the attenuation circuit which has the first semiconductor variable impedance element, and an attenuation control circuit of which the impedance is changed by the control voltage to be applied from the outside and which has the second semiconductor variable impedance element for controlling the impedance of the first semiconductor variable impedance element. Here, the attenuation circuit and the attenuation control circuit are connected to the signal path in cascade. Therefore, signals can be attenuated by the attenuation control circuit, in addition to the attenuation circuit. As a result, a larger attenuation amount can be obtained.

According to the second aspect of the invention, the first semiconductor variable impedance element is constituted by the PIN diode, and the second semiconductor variable impedance element is constituted by the transistor. The PIN diode is coupled between the signal line and the ground, and the collector and the emitter of the transistor are coupled to the signal line and the ground, respectively. Further, the control voltage is applied to the base of the transistor, such that the collector current of the transistor flows in the PIN diode. Therefore, the impedance of the transistor and the impedance of the PIN diode can be changed by the control voltage.

According to the third aspect of the invention, the transistor is constituted by a PNP transistor, and the anode of the PIN diode is coupled to the signal line and is pulled up to the power supply via the choke inductor. The collector of the PNP transistor is grounded and an emitter thereof is coupled to the signal line and is pulled up to the power supply via the first resistor. Further, the emitter of the PNP transistor is connected to the cathode of the PIN diode via the radio-frequency insulating element. Therefore, a large attenuation amount can be obtained with the simplest configuration.

According to the fourth aspect of the invention, the amplifying circuit is interposed between the attenuation circuit and the attenuation control circuit. Therefore, a large attenuation amount can be obtained with small distortion of the amplifying circuit.

DESCRIPTION OF THE PREFERRED EMBODIMENT

Figure 1:
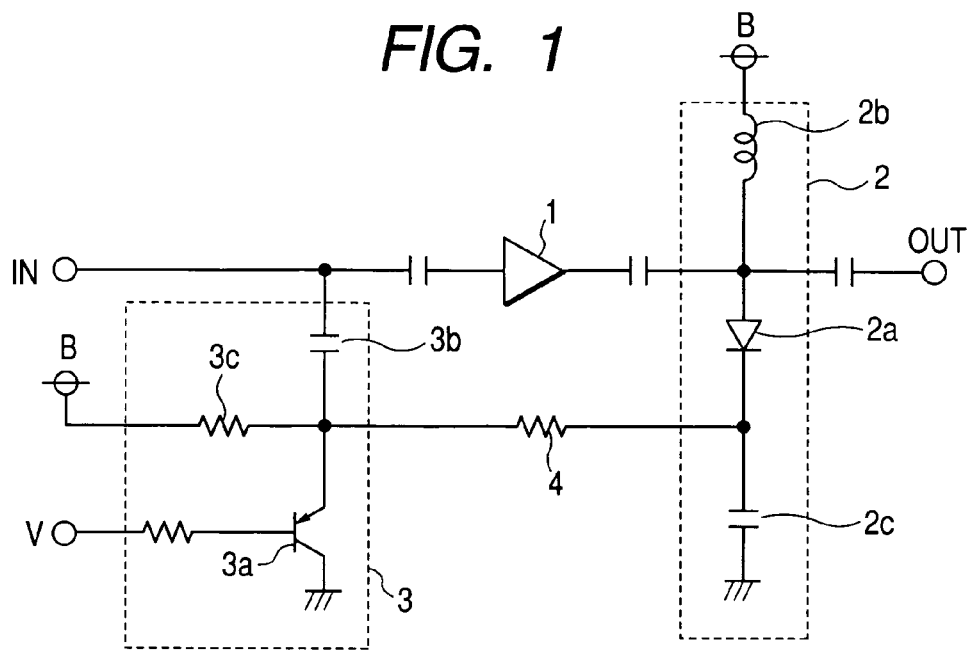
FIG. 1 is a circuit diagram showing a variable attenuation circuit according to the present invention.
Figure 2:
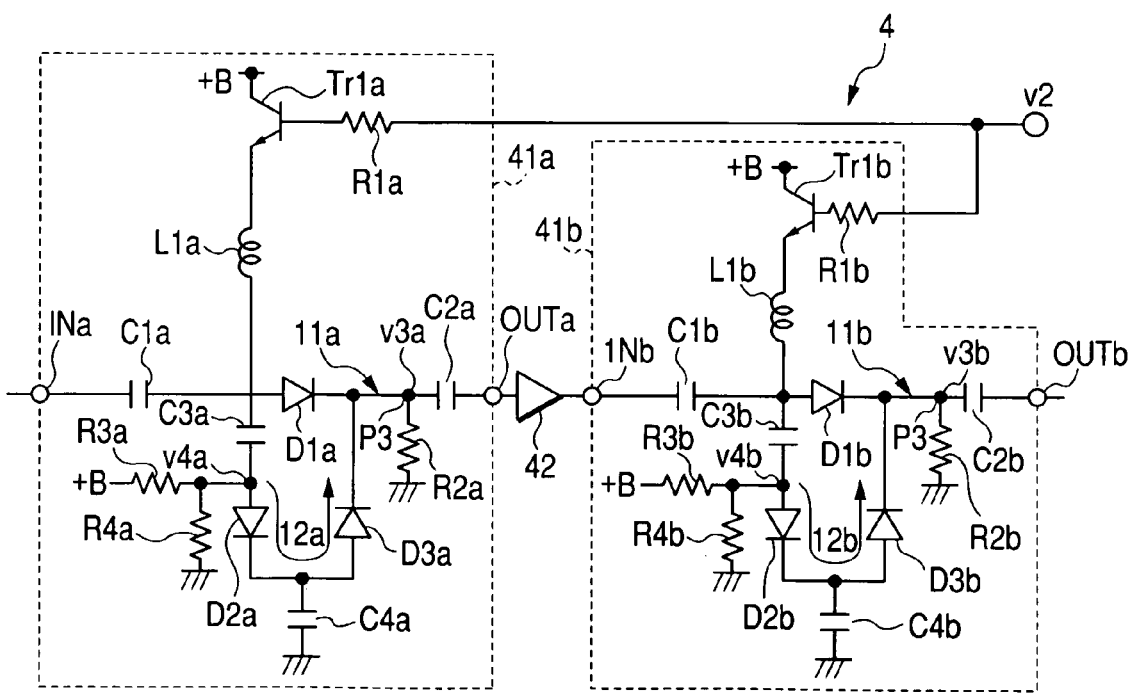
FIG. 2 is a circuit diagram showing a variable attenuation circuit according to the related art.

A variable attenuation circuit of the present invention will now be described with reference to FIG. 1. An attenuation circuit 2 is connected to the post-stage of an amplifying circuit 1 and an attenuation control circuit 3 is connected to the pre-stage of the amplifying circuit 1. A PIN diode 2a is used for the attenuation circuit 2 as a first semiconductor variable impedance element, and an anode of the PIN diode 2a is coupled to a signal line on the output side of the amplifying circuit 1. Further, the anode of the PIN diode 2a is pulled up to a power supply B via a choke inductor 2b and a cathode thereof is grounded by a direct current (DC) blocking capacitor 2c in radio-frequency wise.

A PNP transistor 3a is used for the attenuation control circuit 3 as a second semiconductor variable impedance element. A collector of the PNP transistor 3a is grounded. Further, an emitter of the PNP transistor 3a is coupled to the signal line on the input side of the amplifying circuit 1 via a capacitor 3b and is pulled up to the power supply B via a resistor 3c. Further, the emitter of the PNP transistor 3a is connected to the cathode of the PIN diode 2a via a resistor 4, such that a control voltage is applied to a base of the PNP transistor 3a. The control voltage V is changed in a voltage range lower than the power supply B.

In this configuration, when the control voltage V is substantially equal to the power supply B, the transistor 3a is maintained in an OFF state and a collector current does not flow, such that the voltage of the collector is equal to the voltage of the power supply B. Therefore, the voltage of the cathode of the PIN diode 2a also is substantially equal to the voltage of the power supply B, and thus a current does not flow in the PIN diode 2a. As a result, a signal inputted to an input terminal IN is amplified by the amplifying circuit 1, without being attenuated by the attenuation control circuit 3 and the attenuation circuit 2, and then is outputted to an output terminal OUT.

As the control voltage is lower than the voltage of the power supply B, the collector current of the transistor 3a is increased and the collector voltage is gradually decreased. Therefore, the current flowing in the PIN diode 2a is also gradually increased. As the collector current of the transistor 3a is increased, an equivalent resistance value between the collector and the emitter is gradually decreased. Further, as the current of the PIN diode 2a is increased, an equivalent resistance value between the anode and the cathode is gradually decreased. Therefore, the level of the signal inputted to the amplifying circuit 1 and the level of the signal outputted from the amplifying circuit 1 are lowered.

As described above, the level of the signal is attenuated by the attenuation control circuit 3, in addition to the attenuation circuit 2. Therefore, a large attenuation amount can be obtained with a simple configuration. Further, since the amplifying circuit 1 is interposed between the attenuation circuit 2 and the attenuation control circuit 2, the distortion at the time of attenuation can be improved.

Further, the configuration of the attenuation circuit 2 is not limited to the configuration shown in FIG. 1. For example, the PIN diode may be constituted by a π type or an L type.

The invention claimed is:

1. A variable attenuation circuit comprising:
   an attenuation circuit which has a first semiconductor variable impedance element, and
   an attenuation control circuit of which the impedance is changed by a control voltage to be applied from the outside and which has a second semiconductor variable impedance element for controlling the impedance of the first semiconductor variable impedance element,
   wherein the attenuation circuit and the attenuation control circuit are connected to a signal path in cascade and signals can be attenuated by both the attenuation circuit and the attenuation control circuit.

2. The variable attenuation circuit according to claim 1, wherein the first semiconductor variable impedance element is constituted by a PIN diode, and the second semiconductor variable impedance element is constituted by a transistor,
   the PIN diode is coupled between a signal line and a ground,
   a collector and an emitter of the transistor are coupled to the ground and the signal line, respectively, and the control voltage is applied to a base of the transistor, such that an emitter current of the transistor flows in the PIN diode.

3. A variable attenuation circuit, comprising:
   an attenuation circuit which has a first semiconductor variable impedance element, and
   an attenuation control circuit of which the impedance is changed by a control voltage to be applied from the outside and which has a second semiconductor variable impedance element for controlling the impedance of the first semiconductor variable impedance element,
   wherein the attenuation circuit and the attenuation control circuit are connected to a signal path in cascade,
   wherein an amplifying circuit is interposed between the attenuation circuit and the attenuation control circuit.

4. A variable attenuation circuit, comprising:
   an attenuation circuit which has a first semiconductor variable impedance element, and
   an attenuation control circuit of which the impedance is changed by a control voltage to be applied from the outside and which has a second semiconductor variable impedance element for controlling the impedance of the first semiconductor variable impedance element,
   wherein the attenuation circuit and the attenuation control circuit are connected to a signal path in cascade,
   wherein the first semiconductor variable impedance element is constituted by a PIN diode, and the second semiconductor variable impedance element is constituted by a transistor,
   the PIN diode is coupled between a signal line and a ground,
   a collector and an emitter of the transistor are coupled to the ground and the signal line, respectively, and the control voltage is applied to a base of the transistor, such that an emitter current of the transistor flows in the PIN diode,
   wherein the transistor is constituted by a PNP transistor,
   an anode of the PIN diode is coupled to the signal line and is pulled up to a power supply via a choke inductor,
   a collector of the PNP transistor is grounded,
   an emitter of the PNP transistor is connected to the signal line and is pulled up to the power supply via a first resistor, and
   the emitter of the PNP transistor is connected to a cathode of the PIN diode via a radio-frequency insulating element.

* * * * *